(12) United States Patent
Tomita et al.

(10) Patent No.: US 8,981,854 B2
(45) Date of Patent: Mar. 17, 2015

(54) CLOCK DISTRIBUTOR AND ELECTRONIC APPARATUS

(71) Applicant: Fujitsu Limited, Kawasaki-shi, Kanagawa (JP)

(72) Inventors: Yasumoto Tomita, Kawasaki (JP); Hirotaka Tamura, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 64 days.

(21) Appl. No.: 13/875,837

(22) Filed: May 2, 2013

(65) Prior Publication Data

US 2013/0328632 A1    Dec. 12, 2013

(30) Foreign Application Priority Data

Jun. 8, 2012 (JP) ................................. 2012-130827

(51) Int. Cl.
| | | |
|---|---|---|
| *H03L 7/099* | (2006.01) | |
| *H03L 7/24* | (2006.01) | |
| *G06F 1/10* | (2006.01) | |
| *H03L 7/18* | (2006.01) | |
| *H03L 7/07* | (2006.01) | |
| *H03L 7/08* | (2006.01) | |

(52) U.S. Cl.
CPC .. *H03L 7/18* (2013.01); *G06F 1/10* (2013.01); *H03L 7/07* (2013.01); *H03L 7/0805* (2013.01); *H03L 7/099* (2013.01); *H03L 7/24* (2013.01)
USPC ........ 331/2; 331/47; 331/55; 331/56; 331/74; 331/172; 331/179; 327/144; 327/296; 327/297

(58) Field of Classification Search
USPC .......... 327/144, 291–297, 563; 331/2, 46, 47, 331/49, 55–57, 74, 172, 173, 179
See application file for complete search history.

(56) References Cited

U.S. PATENT DOCUMENTS 5,357,217 A * 10/1994 Marchesi et al. ................ 331/57
5,475,344 A * 12/1995 Maneatis et al. ................ 331/57

(Continued)

FOREIGN PATENT DOCUMENTS

| JP | 08-070239 A | 3/1996 |
|---|---|---|
| JP | 11-074762 A | 3/1999 |

(Continued)

*Primary Examiner* — Levi Gannon
(74) *Attorney, Agent, or Firm* — Arent Fox LLP

(57) ABSTRACT

A clock distributor includes a first oscillator and a second oscillator, to each of which a signal controlling an oscillation frequency is input and to one of which a clock is input; a wiring portion that connects the first oscillator and the second oscillator; a first conversion element that converts an output from the first oscillator into electric current, and outputs a result to a first connection portion connecting to the wiring portion; a second conversion element that converts voltage of the first connection portion into electric current, and outputs a result to the first oscillator; a third conversion element that converts an output from the second oscillator into electric current, and outputs a result to a second connection portion connecting to the wiring portion; and a fourth conversion element that converts voltage of the second connection portion into electric current, and outputs a result to the second oscillator.

10 Claims, 13 Drawing Sheets

(56) References Cited

U.S. PATENT DOCUMENTS

| | | | |
|---|---|---|---|
| 6,617,936 B2* | 9/2003 | Dally et al. | 331/57 |
| 6,683,503 B2* | 1/2004 | Mizuno et al. | 331/46 |
| 7,155,188 B2* | 12/2006 | Noboru et al. | 455/255 |
| 7,336,135 B2* | 2/2008 | Higashi et al. | 331/108 B |
| 8,258,882 B2* | 9/2012 | Shibasaki et al. | 331/55 |
| 2002/0003452 A1 | 1/2002 | Mizuno et al. | |
| 2007/0063779 A1 | 3/2007 | Kanda et al. | |

FOREIGN PATENT DOCUMENTS

| | | |
|---|---|---|
| JP | 11-150417 A | 6/1999 |
| JP | 2007-082158 A | 3/2007 |
| JP | 2010-258516 A | 11/2010 |

\* cited by examiner

CLOCK DISTRIBUTOR AND ELECTRONIC APPARATUS

CROSS-REFERENCE TO RELATED APPLICATION

This application is based upon and claims the benefit of priority of the prior Japanese Patent Application No. 2012-130827, filed on Jun. 8, 2012, the entire contents of which are incorporated herein by reference.

FIELD

The embodiments discussed herein are related to a clock distributor and an electronic apparatus.

BACKGROUND

In the related art, there is an apparatus for generating and distributing a clock signal, which includes multiple first LC resonance oscillators, each of which supplies a clock for each of multiple circuit blocks via a buffer, a second LC resonance oscillator with the same physical configuration as those of the multiple first LC resonance oscillators, a frequency divider that is connected to a feedback loop of the second LC resonance oscillator, a phase comparator, a charge pump, and a low-pass filter. A resistance element is inserted between oscillation nodes of the multiple first LC resonance oscillators and the second LC resonance oscillator.

Furthermore, there is an oscillator that includes at least two ring oscillation circuits, in each of which multiple inverters are connected to each other in multiple steps in the shape of a ring and conductive wiring, and in which an output from at least one inverter of all the ring oscillation circuits is connected to the conductive wiring.

Japanese Laid-open Patent Publication Nos. 2007-82158 and 11-74762 are examples of the related art, for example.

SUMMARY

As described above, in the apparatus for generating and distributing the clock signal in the related art, the oscillation nodes of the multiple first LC resonance oscillators and the second LC resonance oscillator are connected directly via the resistance element. For this reason, a load of each oscillation node on the multiple first LC resonance oscillators and the second LC resonance oscillator is increased and thus there occurs a problem in that oscillation at a high frequency is difficult.

Furthermore, in the oscillator in the related art, since an output from at least one inverter of all the ring oscillation circuits is connected directly via conductive wiring, a load on a ring oscillation circuit is increased and thus there occurs a problem in that the oscillation at the high frequency is difficult.

In this manner, in the related art since the oscillation nodes are connected directly in the apparatus for generating and distributing the clock signal and in the oscillator, the load of the oscillation node is increased and thus there occurs a case where the oscillation at the high frequency is difficult.

According to an aspect of the embodiment, a clock distributor includes a first oscillator and a second oscillator, to each of which a signal controlling an oscillation frequency is input and to one of which a clock is input; a wiring portion that connects the first oscillator and the second oscillator; a first conversion element that converts an output from the first oscillator into electric current, and outputs a result to a first connection portion connecting to the wiring portion; a second conversion element that converts voltage of the first connection portion into electric current, and outputs a result to the first oscillator; a third conversion element that converts an output from the second oscillator into electric current, and outputs a result to a second connection portion connecting to the wiring portion; and a fourth conversion element that converts voltage of the second connection portion into electric current, and outputs a result to the second oscillator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
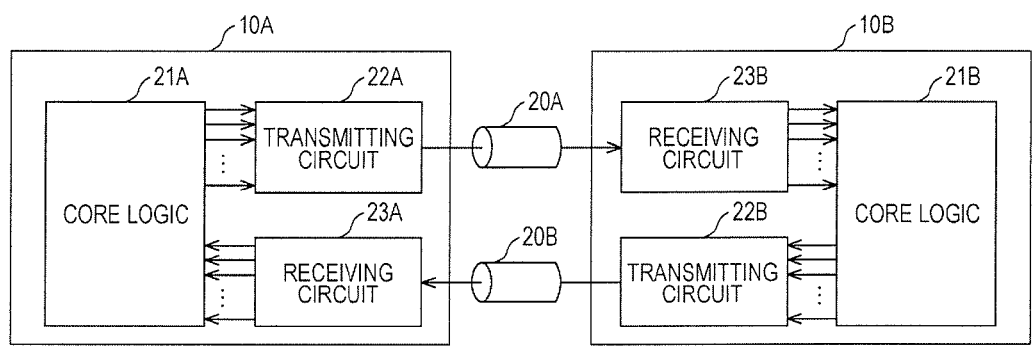
FIG. 1 illustrate an IC chip including a clock distributor according to a first embodiment.

Embodiments of a clock distributor and an electronic apparatus equipped with the clock distributor disclosed in the present specification are described below referring to the drawings.

FIG. 1 illustrates an IC chip including a clock distributor according to a first embodiment.

As illustrated in FIG. 1, integrated circuit (IC) chips 10A and 10B are connected to each other via transmission paths 20A and 20B.

Each of the IC chips 10A and 10B is installed, for example, as a large scale integrated circuit (LSI). The transmission paths 20A and 20B, for example, schematically illustrate the wiring of a backplane to which the IC chips 10A and 10B are mounted.

The IC chip 10A includes a core logic 21A, a transmitting circuit 22A, and a receiving circuit 23A. Similarly, the IC chip 10B includes a core logic 21B, a transmitting circuit 22B, and a receiving circuit 23B.

The clock distributor according to the first embodiment, for example, is included in the transmitting circuit 22A, the receiving circuit 23A, the transmitting circuit 22B and the receiving circuit 23B.

The transmitting circuit 22A, the receiving circuit 23A, the transmitting circuit 22B, the receiving circuit 23B, and the IC chips 10A and 10B are one example of an electronic apparatus that includes the clock distributor according to the first embodiment.

Each of the core logics 21A and 21B is a core that contains a central processing unit (CPU).

The input side of the transmitting circuit 22A is connected to the core logic 21A, and the output side is connected to the receiving circuit 23B of the IC chip 10B via the transmission path 20A. The output side of the receiving circuit 23A is connected to the core logic 21A, and the input side is connected to the transmitting circuit 22B of the IC chip 10B via the transmission path 20B.

The input side of the transmitting circuit 22B is connected to the core logic 21B, and the output side is connected to the receiving circuit 23A of the IC chip 10A via the transmission path 20B. The output side of the receiving circuit 23B is connected to the core logic 21B, and the input side is connected to the transmitting circuit 22A of the IC chip 10A via the transmission path 20A.

When data is transmitted between the IC chips 10A and 10B via the transmission paths 20A and 20B such as the backplane, a clock signal is used which is synchronized with transmission data.

For this reason, in the IC chips 10A and 10B according to the first embodiment, the transmitting circuit 22A and the transmitting circuit 22B that transmit the data, and the receiving circuit 23A and the receiving circuit 23B that receive the data have their respective clock distributors inside which distributes a clock.

Figure 2:
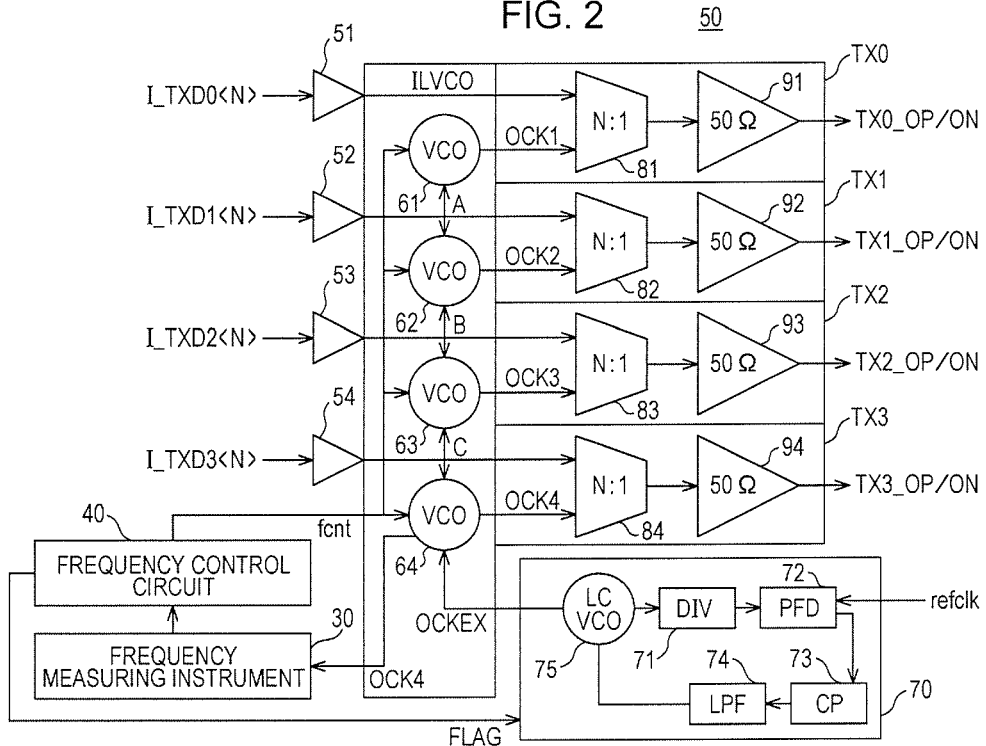
FIG. 2 illustrates a multi-channel type transmitting circuit that includes the clock distributor according to the first embodiment.

FIG. 2 illustrates a multi-channel type transmitting circuit 50 that includes the clock distributor according to the first embodiment.

The transmitting circuit 50 includes buffers 51 to 54, voltage-controlled type oscillators (VCO) 61 to 64, and transmitting units TX0, TX1, TX2, and TX3.

The buffers 51 to 54 are circuit elements to which to input data I_TXD0<N> to I_TXD3<N> that is to be input to transmitting units TX0 to TX3 of the transmitting unit 50. For example, when the transmitting circuit 50 is used as the transmitting circuit 22A illustrated in FIG. 1, the data to be transmitted from the core logic 21A to the IC chip 10B are input to the buffers 51 to 54. Similarly, when the transmitting circuit 50 is used as the transmitting circuit 22B illustrated in FIG. 1, the data to be transmitted from the core logic 21B to the IC chip 10A are input to the buffers 51 to 54.

The VCOs 61 to 64 are the voltage controlled oscillators. The VCOs 61 to 64 input clocks OCK1 to OCK4 to input terminals of multiplexers 81 to 84 of the transmitting units TX0 to TX3, respectively.

The transmitting units TX0, TX1, TX2, and TX3 include the multiplexers 81 to 84 and buffers 91 to 94, respectively. The transmitting unit TX0 to TX3 convert the input data I_TXD0<N> to I_TXD3<N>, which are input to the buffers 51 to 54, from parallel data into serial data in the multiplexers 81 to 84, based on the clocks OCK1 to OCK4 at which the VCOs 61 to 64 oscillate, respectively, and transmit transmission data TX0_OP/ON to TX3_OP/ON from the buffers 91 to 94, respectively.

The VCOs 61 to 64 are combined with each other as represented by arrows A to C, and a phase adjustment signal fcnt, which is output by a frequency control circuit 40, is input to the VCOs 61 to 64. When this is done, application of mutual synchronization is performed on the VCOs 61 to 64. An operation caused by a combination relationship between and the application of the mutual synchronization to the VCOs 61 to 64 is described below.

Furthermore, the transmitting circuit 50 includes a phase locked loop 70 that applies the clock to one VCO 64 among the multiple VCOs 61 to 64. Since the application of the mutual synchronization is performed based on the clock applied to the VCO 64, the VCOs 61 to 64 oscillate at the same frequency as the clock applied from the phase locked loop 70.

The clock that the phase locked loop 70 applies to the VCO 64 is distributed also to the other VCOs 61 to 63 by the application of the mutual synchronization. At this point, when a noise is included in the clock that the phase locked loop 70 applies to the VCO 64, the noise gets included in the clock distributed to the other VCOs 61 to 63 via the VCO 64 as well. For this reason, it is preferable that the phase locked loop 70 generates the clock with little noise. Therefore, it is preferable that the phase locked loop 70 has the oscillator that generates the clock with little noise.

According to the first embodiment, the phase locked loop 70 has an LCVCO 75, which performs LC resonance oscillation, as an oscillator that generates the clock with little noise. Moreover, the phase locked loop 70 may have a different oscillator, such as a crystal oscillator, as long as that oscillator generates the clock with little noise.

Furthermore, the phase locked loop 70 has a divider (DIV) 71, a phase frequency detector (PFD) 72, a charge pump (CP) 73, and a low pass filter (LPF) 74.

The DIV 71 is a frequency divider, and is connected between the LCVCO 75 and the PFD 72. The DIV 71 divides the clock which is input by N (N is an integer), generates a clock with which a reference clock refclk is compared, and outputs the result.

The PFD 72 is connected between the DIV 71 and the CP 73. Furthermore, the reference clock refclk, for example, from the crystal oscillator not illustrated, is input to the PFD 72. The PFD 72 detects a phase difference between the clock that is input from the DIV 71 and the reference clock refclk and outputs an error signal (analog signal) that depends on the phase difference.

The CP 73 converts the analog error signal, which is output from the PFD 72, into an electric current error signal.

The LPF 74 integrates the electric current error signal, which is output from the CP 73, and removes a short period signal, and thus outputs a signal for adjusting a phase of the LCVCO 75.

When this is done, the LCVCO 75 outputs a clock OCKEX that is consistent in phase with the reference clock refclk, to the VCO 64.

Moreover, the transmitting circuit 50 includes a frequency measuring instrument 30 that measures a frequency of a clock OCK4 at which the LCVCO 75 oscillates, and the frequency control circuit 40 that generates a control signal based on a result of the frequency measuring instrument 30 measuring the frequency, and outputs the generated control signal to the multiple VCOs 61 to 64.

The frequency control circuit 40 outputs the phase adjustment signal fcnt, which is a common control signal which controls free-running oscillation frequencies of the multiple VCOs 61 to 64, to the multiple VCOs 61 to 64.

The frequency control circuit 40 may output the phase adjustment signal fcnt to the multiple VCOs 61 to 64, in such a manner that the free-running oscillation frequency of each of the VCOs 61 to 64 is within ±90 degrees, in terms of the multiple VCOs 61 to 64 oscillating at the same frequency as the clock OCKEX.

Operations of the frequency control circuit 40 and the frequency measuring instrument 30 are described below.

The VCOs 61 to 64, the phase locked loop 70, the frequency measuring instrument 30 and the frequency control circuit 40, among constituent elements of the transmitting circuit 50, make up the clock distributor.

Figure 3:
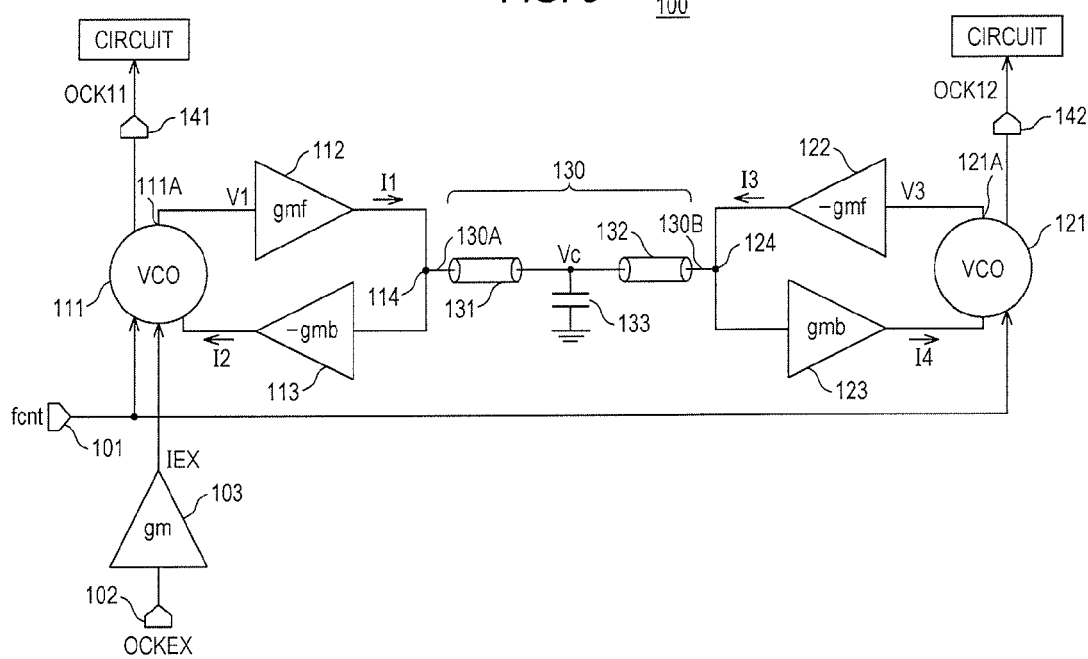
FIG. 3 illustrates the clock distributor according to the first embodiment.

FIG. 3 illustrates a clock distributor 100 according to the first embodiment.

The clock distributor 100 includes a phase adjustment signal input terminal 101, VCOs 111 and 121, GM elements 112, 113, 122, and 123, wiring 130, and output terminals 141 and 142. The phase adjustment signal fcnt from the frequency control circuit 40 is input to the phase adjustment signal input terminal 101.

Furthermore, the clock distributor 100 includes a clock input terminal 102 to which the clock OCKEX from the phase locked loop 70 is input, and a GM element 103 that converts a voltage of the clock OCKEX into electric current IEX and outputs the result to the VCO 111.

In FIG. 3, the clock distributor 100 including two of the VCOs 111 and 121 is used to make it easy to understand the operation caused by the combination relationship between the VCOs and the application of the mutual synchronization to the VCOs, and the phase locked loop 70, the frequency measuring instrument 30, and the frequency control circuit 40, which are illustrated in FIG. 2, are omitted. A correspondence relationship between the clock distributor 100 illustrated in FIG. 3 like this, and the transmitting circuit 50 illustrated in FIG. 2 is as follows.

The VCO 111 corresponds to the VCO 64 illustrated in FIG. 2, and the clock OCKEX from the phase locked loop 70 is input to the VCO 111.

Furthermore, the VCO 121 corresponds to any one of the VCOs 61 to 64 illustrated in FIG. 2. For this reason, the VCO 121 is connected to the same transmitting unit as any one of the transmitting units TX0 to TX2 and outputs a clock OCK12.

Furthermore, the GM elements 112, 113, 122, and 123 and the wiring 130 which are illustrated in FIG. 3 illustrate the combination relationship between the VCOs 111 and 121 and are equivalent to the combination relationship between the VCOs 61 to 64 represented by arrows A to C in FIG. 2.

As illustrated in FIG. 3, an oscillation node 111A of the VCO 111 is connected to one end 130A of the wiring 130 via the GM element 112 and the GM element 113 is feedback-connected to the VCO 111 and the GM element 112. The one end 130A of the wiring 130 is connected to a connection portion 114 between the GM elements 112 and 113. At this point, the VCO 111 is one example of a first oscillator to which the clock is applied.

The GM element 112 has conductance gmf, and converts the clock, which is output from the oscillation node 111A of the VCO 111, (from a voltage V1) into electric current I1 and thus outputs the result. The GM element 112 is one example of a first voltage current conversion element.

The GM element 113 has conductance (−gmb), and converts a voltage of the connection portion 114 into electric current I2 and thus outputs the result to the VCO 111. The GM element 113 is one example of a second voltage current conversion element.

An oscillation node 121A of the VCO 121 is connected to the other end 130B of the wiring 130 via the GM element 122 and the GM element 123 is feedback-connected to the VCO 121 and the GM element 122. The other end 130B of the wiring 130 is connected to a connection portion 124 between the GM elements 122 and 123. At this point, the VCO 121 is one example of a second oscillator.

The GM element 122 has the conductance (−gmf), and converts the clock, which is output from the oscillation node 121A of the VCO 121 (from a voltage V3), into electric current I3 and thus outputs the result. The GM element 122 is one example of a third voltage current conversion element.

The GM element 123 has the conductance gmb, and converts the voltage of the connection portion 124 into electric current I4 and thus outputs the result to the VCO 121. The GM element 123 is one example of a fourth voltage current conversion element.

The one end 130A of the wiring 130 is connected to the connection portion 114 between the GM elements 112 and 113, and the other end 130B is connected to the connection portion 124 between the GM elements 122 and 123. The wiring 130 is built with the internal wiring of the LSI.

In FIG. 3, wiring portions 131 and 132 and a capacitor 133 are schematically illustrated to describe the wiring 130 and a parasitic capacitance of the wiring 130.

At this point, since the GM elements 112 and 122 convert clock voltages in opposite phase into electric current, a voltage Vc depending on a difference (=I1−I3) in output electric current between the GM elements 112 and 122 occurs in the wiring 130. In the clock distributor 100 according to the first embodiment, subtraction between the output electric current I1 from the GM element 112 and the output electric current I3 from the GM element 122 is realized by connecting the clock voltages in opposite phase with wiring 130 using the GM elements 112 and 122.

Therefore, the GM elements 113 and 123 convert the voltage Vc into the electric current I2 and the electric current I4, and thus feed the result back to the VCOs 111 and 121, respectively. Since the GM elements 113 and 123 convert the Voltage Vc into electric current together, the electric current I2 and the electric current I4 are equivalent in value to each other.

For this reason, equivalent electric current may be fed back to the VCOs 111 and 121.

In the clock distributor 100 illustrated in FIG. 3, when the clock OCKEX from the phase locked loop 70 is input to the clock input terminal 102 and thus the VCO 111 is in a locked state, the equivalent electric current may be fed back to the VCOs 111 and 121 and thus the application of the mutual synchronization may be performed on the VCOs 111 and 121. Therefore, the frequencies of clocks OCK11 to OCK12 at which the VCOs 111 and 121 oscillate, respectively, become equivalent to the clock OCKEX from the phase locked loop 70.

In terms of promptly synchronizing the VCOs 111 and 121 with the clock OCKEX, the size of the electric current IEX into which the clock OCKEX is converted may be greater than the electric current I2 and the electric current I4 that are output from the GM elements 113 and 123 to the VCOs 111 and 121, respectively.

Figure 4:
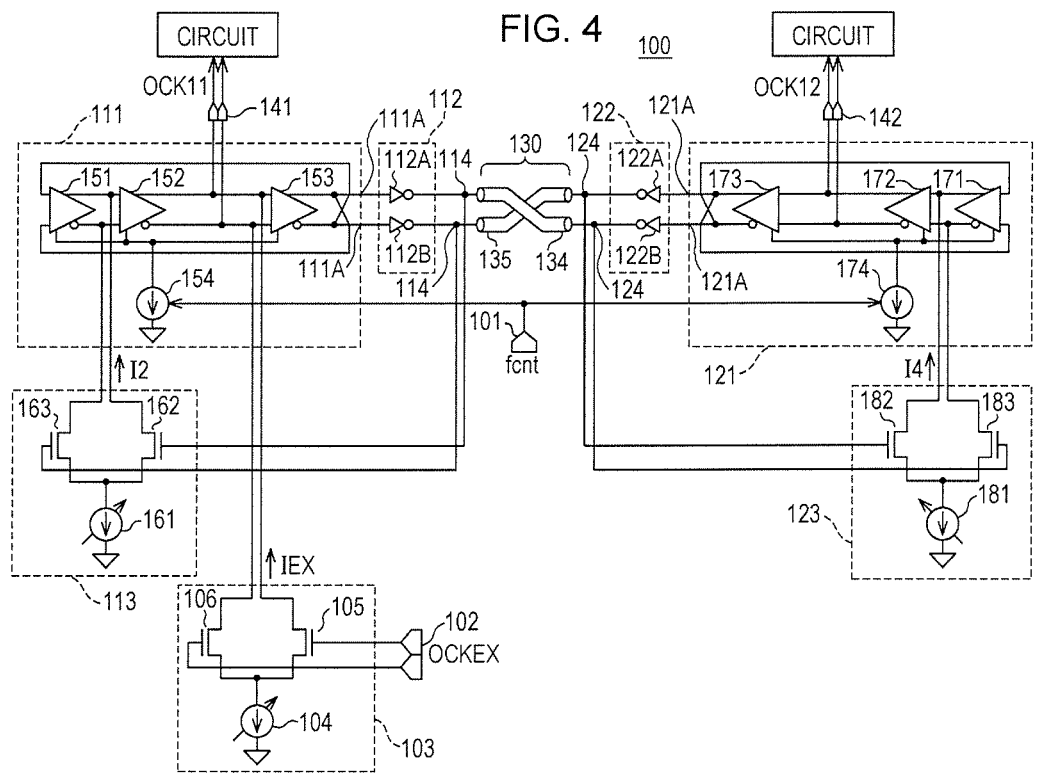
FIG. 4 illustrates a circuit configuration of the clock distributor according to the first embodiment.

Next, a circuit of the clock distributor 100 according to the first embodiment is described in detail referring to FIG. 4.

FIG. 4 illustrates a circuit configuration of the clock distributor 100 according to the first embodiment. In FIG. 4, the VCOs 111 and 121, which are assumed to output differential clocks together, are described.

The VCO 111 includes three-step inverters 151, 152, and 153, and an electric current source 154. The inverters 151 to 153, each of which is a current-starved type inverter, make up a ring oscillator. The VCO 111 is a type of ring oscillator.

That is, the inverters 151 to 153 are connected to each other in series, and a non-inversion output terminal of the inverter 153 is connected to an inversion input terminal (a lower input terminal in FIG. 4) of the inverter 151. Furthermore, the inversion input terminal of the inverter 153 is connected to the non-inversion input terminal (an upper input terminal in FIG. 4) of the inverter 151.

Moreover, each of the inverters 151 to 153 is an inverter that is realized as a complementary metal oxide semiconductor (CMOS) device, as one example.

The free-running oscillation frequency of the VCO 111 is controlled by adjusting a value of output electric current from the electric current source 154 with the phase adjustment signal fcnt that is input to the phase adjustment signal input terminal 101.

Moreover, the clock OCK11 which is output by the VCO 111 may be taken from an output terminal of any one of the inverters 151 to 153 that makes up the ring oscillator, but an output from the inverter 152 may be taken as an output from the VCO 111, as one example, in FIG. 4. A differential-form clock OCK11 is output from the output terminal 141.

Furthermore, an input destination of the electric current I2 that is fed back from the GM element 113 may be the input terminal of any one of the inverters 151 to 153 that makes up the ring oscillator, but the electric current I2 is input to the input terminal of the inverter 152 in FIG. 4.

The GM element 112 may be an element that converts the output from the VCO 111 into electric current, and inverters 112A and 112B are used as the GM element 112 in FIG. 4. Conductance of the inverters 112A and 112B are all gmf.

An output terminal of the inverter 112A is connected to the GM element 113, and is connected to an inverter 122B of the GM element 122 via a wiring portion 134 of the wiring 130. The non-inversion output terminal of the inverter 153 of the VCO 111 is connected to the inverter 112A and an inversion output terminal of an inverter 173 of the VCO 121 is connected to the inverter 122B.

For this reason, a voltage caused by a difference in output electric current between the inverters 112A and 122B occurs in a line portion 134.

An output terminal of the inverter 112B is connected to the GM element 113 and is connected to an inverter 122A of the GM element 122 via a wiring portion 135 of the wiring 130. The inversion output terminal of the inverter 153 of the VCO 111 is connected to the inverter 112B and a non-inversion output terminal of the inverter 173 of the VCO 121 is connected to the inverter 122A.

For this reason, a voltage caused by a difference in output electric current between the inverters 112B and 122A occurs in a line portion 135.

The GM element 113 includes an electric current source 161 and two n-type metal oxide semiconductor (NMOS) transistors 162 and 163.

One end (an upper terminal in FIG. 4) of the electric current source 161 is connected to sources of the NMOS transistors 162 and 163 and the other end (a lower terminal in FIG. 4) is grounded.

The source of the NMOS transistor 162 is connected to the source of the NMOS transistor 163 and is connected to the electric current source 161, and a drain of the NMOS transistor 162 is connected between the non-inversion output terminal of the inverter 151 and the non-inversion input terminal of the inverter 152.

The source of the NMOS transistor 163 is connected to the source of the NMOS transistor 162 and is connected to the electric current source 161, and a drain of the NMOS transistor 163 is connected between the inversion output terminal of the inverter 151 and the inversion input terminal of the inverter 152.

The electric current IEX into which a differential-form clock OCKEX is converted from the GM element 103 is input to the VCO 111 described above.

The GM element 103 includes an electric current source 104 and two NMOS transistors 105 and 106.

One end (an upper terminal in FIG. 4) of the electric current source 104 is connected to sources of the NMOS transistors 105 and 106 and the other end (the lower terminal in FIG. 4) is grounded.

The source of the NMOS transistor 105 is connected to the source of the NMOS transistor 106 and is connected to the electric current source 104, and a drain of the NMOS transistor 105 is connected between the non-inversion output terminal of the inverter 152 and the non-inversion input terminal of the inverter 153.

The source of the NMOS transistor 106 is connected to the source of the NMOS transistor 105 and is connected to the electric current source 104, and a drain of the NMOS transistor 106 is connected between the inversion output terminal of the inverter 152 and the inversion input terminal of the inverter 153.

Moreover, the electric current IEX, which is output by the GM element 103, is input between the inverter 152 and the inverter 153, but the electric current IEX, which is output by the GM element 103, may be input between the other inverters.

The VCO 121 includes the three-step inverters 171, 172, and 173, and an electric current source 174. The inverters 171 to 173, each of which is a current-starved type inverter, make up a ring oscillator. The VCO 121 is a type of ring oscillator.

That is, the inverters 171 to 173 are connected to each other in series, and the non-inversion output terminal of the inverter 173 is connected to the inversion input terminal (the lower input terminal in FIG. 4) of the inverter 171. Furthermore, the inversion output terminal of the inverter 173 is connected to the non-inversion input terminal (the upper input terminal in FIG. 4) of the inverter 171.

Moreover, each of the inverters 171 to 173 is an inverter that is realized as a CMOS device, as one example.

The free-running oscillation frequency of the VCO 121 is controlled by adjusting the value of output electric current from the electric current source 174 with the phase adjustment signal fcnt that is input to the phase adjustment signal input terminal 101.

Moreover, the clock OCK12, which is output by the VCO 121, may be taken from the output terminal of any one of the inverters 171 to 173 that make up the ring oscillator, but the output from the inverter 172 may be taken as an output from the VCO 121, as one example, in FIG. 4. A differential-form clock OCK12 is output from the output terminal 142.

Furthermore, the input destination of the electric current I4 that is fed back from the GM element 123 may be the input terminal of any one of the inverters 171 to 173 making up the ring oscillator, but the electric current I4 is input to the input terminal of the inverter 172 in FIG. 4.

The GM element 122 may be an element that converts the output from the VCO 121 into electric current, and the inverters 122A and 122B are used as the GM element 122 in FIG. 4. Conductances of the inverters 122A and 122B are all gmf.

An output terminal of the inverter 122A is connected to the GM element 123, and is connected to the inverter 112B of the GM element 112 via the wiring portion 135 of the wiring 130. The non-inversion output terminal of the inverter 173 of the VCO 121 is connected to the inverter 122A and the inversion output terminal of the inverter 153 of the VCO 111 is connected to the inverter 112B.

For this reason, a voltage caused by a difference in output electric current between the inverters 122A and 112B occurs in the line portion 135.

An output terminal of the inverter 122B is connected to the GM element 123 and is connected to the inverter 112A of the GM element 112 via the wiring portion 134 of the wiring 130. The inversion output terminal of the inverter 173 of the VCO 121 is connected to the inverter 122B and the non-inversion output terminal of the inverter 153 of the VCO 111 is connected to the inverter 112A.

For this reason, a voltage caused by a difference in output electric current between the inverters 122B and 112A occurs in the line portion 134.

The GM element 123 includes an electric current source 181 and two NMOS transistors 182 and 183.

One end (the upper terminal in FIG. 4) of the electric current source 181 is connected to the sources of the NMOS transistors 182 and 183 and the other end (the lower terminal in FIG. 4) is grounded.

The source of the NMOS transistor 182 is connected to the source of the NMOS transistor 183 and is connected to the electric current source 181, and a drain of the NMOS transistor 182 is connected between the non-inversion output terminal of the inverter 171 and the non-inversion input terminal of the inverter 172.

The source of the NMOS transistor 183 is connected to the source of the NMOS transistor 182 and is connected to the electric current source 181, and a drain of the NMOS transistor 183 is connected between the inversion output terminal of the inverter 171 and the inversion input terminal of the inverter 172.

In the clock distributor 100 described above, according to the first embodiment, a voltage caused by a difference in output electric current between the inverters 112A and 122B occurs in the line portion 134, and a voltage caused by a difference in output electric current between the inverters 112B and 122A occurs in the line portion 135.

For this reason, the electric current source 161 of the GM element 113 and the electric current source 181 of the GM element 123 are driven by the voltage caused by the same difference in output electric current. The voltage caused by the difference in the output electric current, which occurs in the line portion 134 and the line portion 135 is a voltage caused by a difference signal between an output signal of the oscillation node 111A of the VCO 111 and an output signal of the oscillation node 121A of the VCO 121.

Therefore, the GM elements 113 and 123 convert the voltage caused by the difference in output electric current, which occurs in the line portion 134 and the line portion 135, into the electric current I2 and the electric current I4 and feed the result back to the VCOs 111 and 121, respectively.

Since the GM elements 113 and 123 convert the voltage caused by the difference in output electric current, which occurs in the line portion 134 and the line portion 135, into electric current together, the electric current I2 and the electric current I4 is equivalent in value to each other.

For this reason, the equivalent electric current may be fed back to the VCOs 111 and 121.

When the clock OCKEX is input from the phase locked loop 70 to the clock input terminal 102 and thus the VCO 111 is in the locked state, the equivalent electric current may be fed back to the VCOs 111 and 121 and thus the application of the mutual synchronization may be performed on the VCOs 111 and 121. Therefore, the frequencies of clocks OCK11 and OCK12 at which the VCOs 111 and 121 oscillate, respectively, become equivalent.

Next, the frequency measuring instrument and the frequency control circuit which are illustrated in FIG. 2, are further described below, referring to the drawings.

Figure 5:
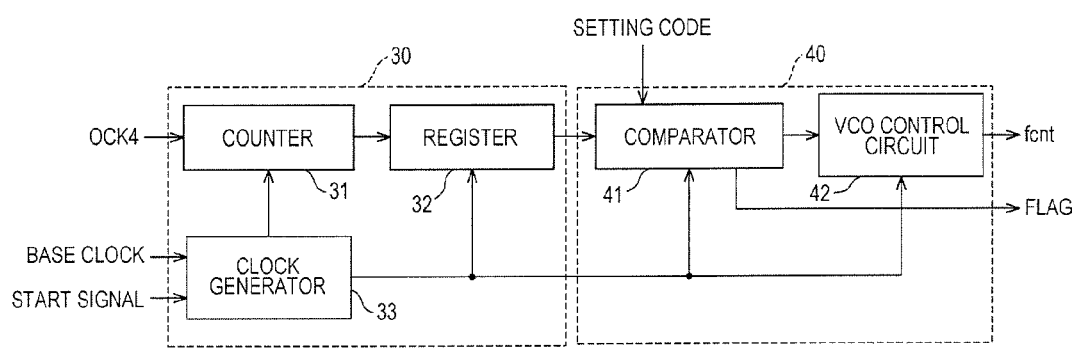
FIG. 5 illustrates a frequency measuring instrument and a frequency control circuit which are illustrated in FIG. 2.

FIG. 5 is a diagram for describing the frequency measuring instrument and the frequency control circuit which are illustrated in FIG. 2.

The frequency measuring instrument 30 has a counter 31 that counts the number of clocks for a given period of time by receiving an input of the clock OCK4, which is output by the VCO 64, and a register 32 that receives an input of a count value counted by the counter 31 and retains the count value. Furthermore, the frequency measuring instrument 30 has a clock generator 33 that receives an input of a start signal from the outside and initializes the register 32. The start signal from an external high-level control circuit is input to the clock generator 33 of the frequency measuring instrument 30.

The frequency control circuit 40 has a comparator 41 compares a setting code, which is a given frequency setting value, with the count value that is a result of the frequency measuring instrument 30 measuring the frequency. The count value from the register 32 is input to the comparator 41. Furthermore, the setting code from the external high-level control circuit is input to the comparator 41. The setting code may be set as a value close to an oscillation frequency of the phase locked loop 70.

Furthermore, the frequency control circuit 40 has a VCO control circuit 42 that generates the phase adjustment signal fcnt that is a control signal controlling the free-running oscillation frequency of each of the VCOs 61 to 64, based on the result of the comparison by the comparator 41. The VCO control circuit 42 is one example of the control signal generation circuit. Moreover, in the clock distributor 100, the phase adjustment signal fcnt is a control signal that controls an electric current value of the electric current source of each VCO. As long as a circuit outputs the control signal like this to generate the phase adjustment signal fcnt, such a circuit is not limited to the frequency control circuit 40.

The frequency control circuit 40 controls the free-running oscillation frequency of the VCO 64, in such a manner that the free-running oscillation frequency of the VCO 64 is made to be a value close to the oscillation frequency of the phase locked loop 70, and further generates and outputs the phase adjustment signal fcnt common to the multiple VCOs 61 to 64, in such a manner that a phase difference between the free-running oscillation frequencies of the multiple VCOs 61 to 64 is within ±90 degrees.

Next, operations of the frequency measuring instrument 30 and the frequency control circuit 40 are described below referring to the drawings.

Figure 6:
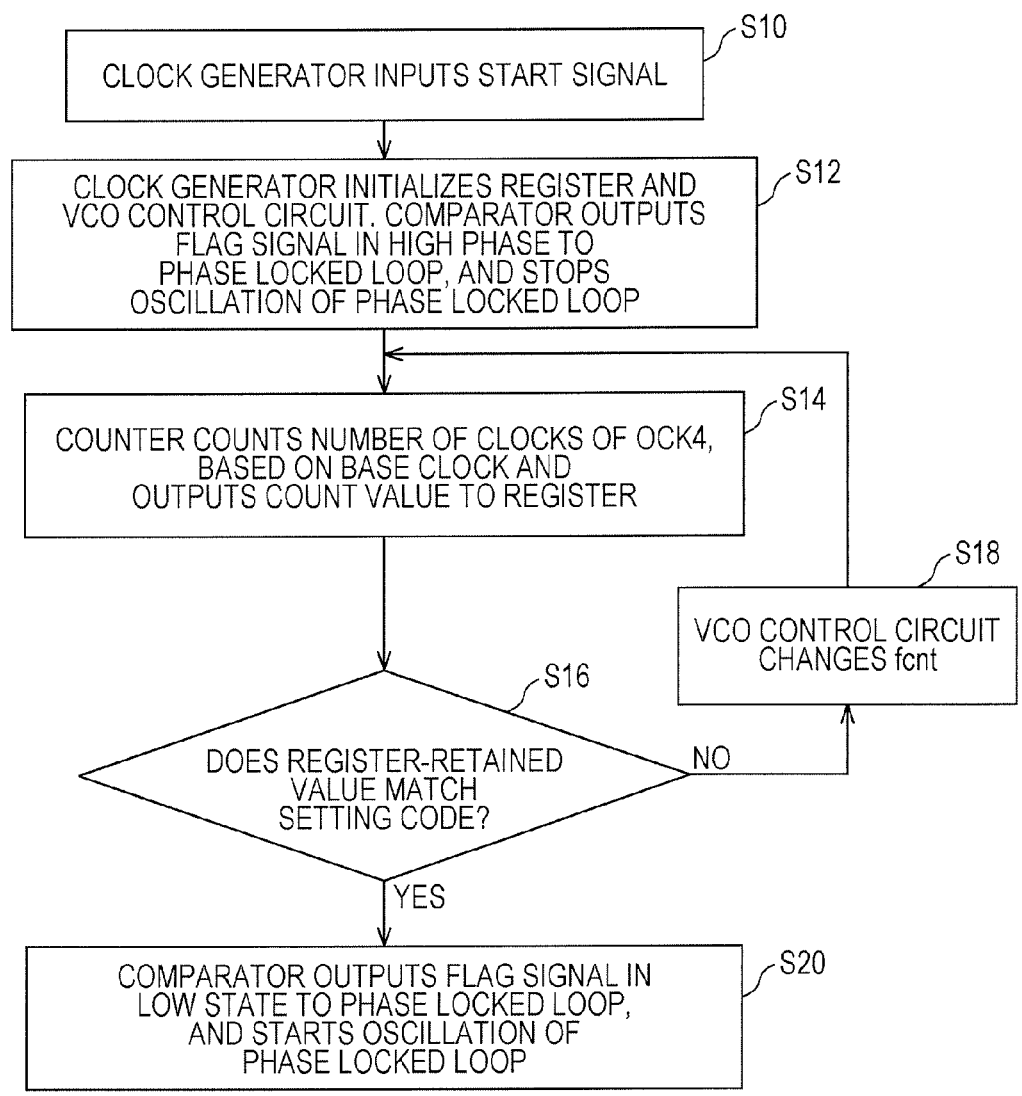
FIG. 6 illustrates a method of operating the frequency measuring instrument and the frequency control circuit which are illustrated in FIG. 2.
Figure 7:
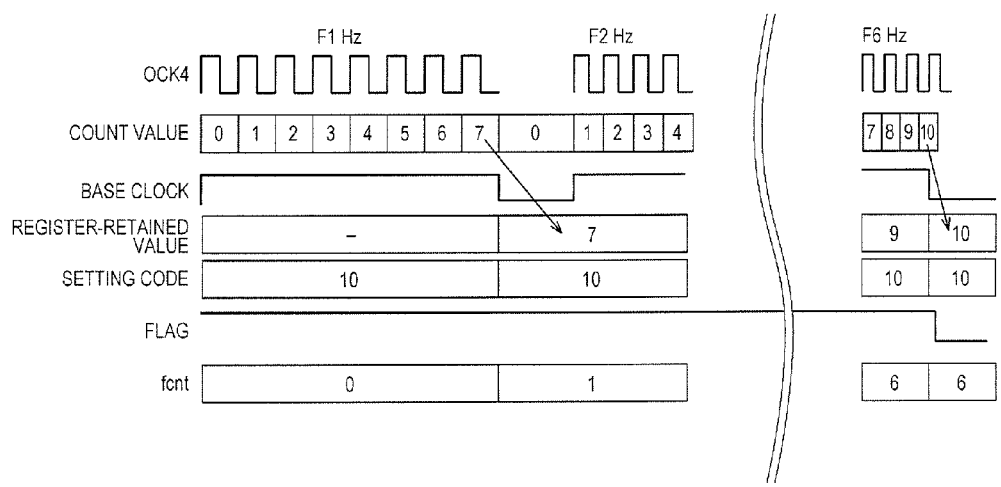
FIG. 7 illustrates a method of operating the frequency measuring instrument and the frequency control circuit which are illustrated in FIG. 2.

FIG. 6 is a flow chart for describing the operations of the frequency measuring instrument and the frequency control circuit that are illustrated in FIG. 2. FIG. 7 is a timing chart for describing the operations of the frequency measuring instrument and the frequency control circuit that are illustrated in FIG. 2.

First, in Step S10, the clock generator 33 of the frequency measuring instrument 30 receives an input of the start signal.

Next, in Step S12, the clock generator 33 initializes the register 32, and the comparator 41 and the VCO control circuit 42 of the frequency control circuit 40. The initialized comparator 41 outputs a flag signal in a high state to the phase locked loop 70, and thus stops oscillation of the phase locked loop 70.

Furthermore, a base clock that determines a predetermined period of time during which to count the number of the clocks of the clock OCK4 is input to the clock generator 33. The reference clock refclk that is input to the phase locked loop 70 may be used as the base clock.

Next, in Step S14, the counter 31 counts the number of the clocks of the clock OCK4, based on the base clock, and outputs the count value to the register 32. The clock generator 33 makes the counter 31 count the number of the clocks of the clock OCK4 over the period of time for which the base clock is in the high state.

In an example illustrated in FIG. 7, a count value of 7 is retained in the register 32, as a result of the counter 31 counting the number of the clocks of the clock OCK4 over the period for which the base clock is in the high state.

Next, in Step S16, the comparator 41 of the frequency control circuit 40 determines whether a register-retained value is consistent with the setting code.

In the example illustrated in FIG. 7, because while the setting code is 10, the register-retained value is 7, both are not consistent with each other. Next, we proceed to Step S18.

Next, in Step S18, the VCO control circuit 42 changes the phase adjustment signal fcnt in such a manner that the register-retained value approaches the setting code. When the register-retained value is smaller than the setting code, the VCO control circuit 42 changes the phase adjustment signal fcnt in such a manner as to increase the register-retained value. On the other hand, when the register-retained value is greater than the setting code, the VCO control circuit 42 changes the phase adjustment signal fcnt in such a manner as to decrease the register-retained value.

In the example illustrated in FIG. 7, since the register-retained value is smaller than the setting code, the VCO control circuit 42 changes the code of the phase adjustment signal fcnt from 0 to 1.

Next, we return back to before Step S14. Steps S14, S16 and S18 are repeated until it is determined in Step S16 that the register-retained value is consistent with the setting code.

In the example illustrated in FIG. 7, the sixth count value in the counter 31 is consistent with the setting code and thus Step S20 starts.

Next, in Step S20, the comparator 41 outputs the flag signal in the low state to the phase locked loop 70 and thus causes the phase locked loop 70 to oscillate.

In this manner, in a state where each of the free-running oscillation frequencies of the multiple VCOs 61 to 64 approaches the oscillation frequency of the phase locked loop 70, the phase locked loop 70 begins to oscillate and thus begins the outputting of the clock OCKEX to the VCO 64.

In the clock distributor described above according to the first embodiment, the VCOs 111 and 121 are combined via the GM elements 112 and 122 and the wiring 130 without connecting directly the oscillation nodes of the VCO as is the case in the related art, in such a manner that the difference signal is obtained between the output signal of the oscillation node 111A of the VCO 111 and the output signal of the oscillation node 121A of the VCO 121.

That is, the subtraction between the output electric current I1 from the GM element 112 and the output electric current I3 from the GM element 122 is realized by connecting the GM element 112 and the GM element 122 that convert the clock voltages in opposite phase into electric current, with the wiring 130.

Then the electric current (the electric current representing the difference signal between the output signal of the oscillation node 111A of the VCO 111 and the output signal of the oscillation node 121A of the VCO 121) obtained by the subtraction is fed back to the VCOs 111 and 121.

Therefore, the increase in loads of the oscillation nodes 111A and 121A on the VCOs 111 and 121 as is the case in the related art may be suppressed, and the oscillation at the same frequency may be realized, which is caused by the application of the mutual synchronization at a higher frequency than in the related art.

Furthermore, when using an LC oscillator with an inductor in the related art, there is a problem in that an area of the inductor is great, but the clock distributor according to the first embodiment has the ring oscillator and thus may decrease the area of the circuit.

Moreover, since the VCOs 111 and 121 oscillate at the same frequency caused by the application of the mutual synchronization as illustrated above, the clocks OCK11 and OCK12 are decreased in skew. For this reason, the clock distributor 100 may distribute the clock, which is decreased in skew, from the VCOs 111 and 121.

Furthermore, according to the first embodiment, the VCO 111 is locked by inputting the clock OCKEX from the phase locked loop 70 that generates the clock with little noise, and additionally the mutual synchronization is applied to the VCO 111 and the VCO 121. For this reason, the clock distributor 100 may distribute the clock with decreased noise, from the VCO 111 and the VCO 121.

Moreover, the embodiment is described above in which the VCOs 111 121 includes the three-step inverters 151 to 153 and the VCO 121 includes the three-step inverters 171 to 173, but the number of the inverter steps of the VCOs 111 and 121 is not limited to 3.

Furthermore, the embodiment is described above in which the GM element 112 includes the inverters 112A and 112B and the GM element 122 includes the inverters 122A and 122B, but each of the GM elements 112 and 122 may be a circuit with a different configuration as long as such an element can convert the voltages, which are output from the oscillation nodes 111A and 121A of the VCOs 111 and 121, into electric current.

Similarly, as long as the GM elements 113 and 123 can convert the difference-caused voltages that occur in the connection portions 114 and 124 into electric current and thus can output the result to the VCOs 111 and 121, respectively, each of the GM elements 113 and 123 may be a circuit with a different configuration from the configuration illustrated in FIG. 4.

Furthermore, the VCOs 111 and 121 are described above as an oscillator that controls the oscillation frequency by controlling a voltage, but may be an oscillator that controls the oscillation frequency by controlling electric current.

Furthermore, the embodiment is described above in which each of the VCOs 111 and 121 is a type of ring oscillator, but each of the VCOs 111 and 121 may be an LC oscillator.

Furthermore, the clock OCKEX which is output by the phase locked loop 70 is described above as applied to the VCO 111, but the clock OCKEX may be applied to the VCO 121.

Figure 8:
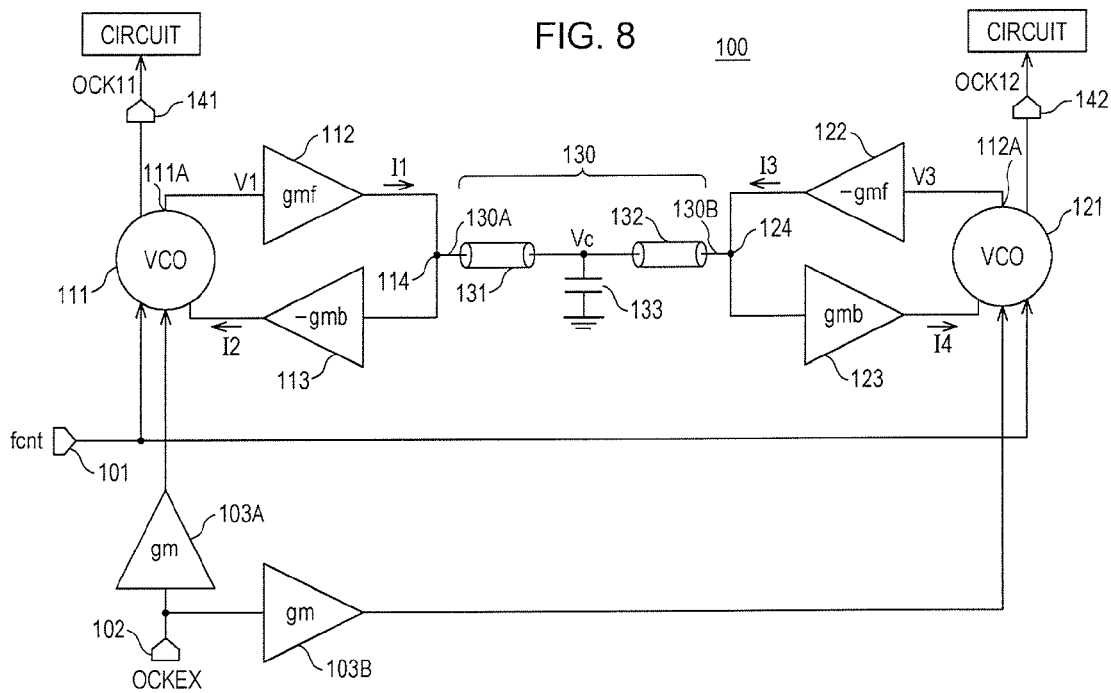
FIG. 8 illustrates a modification example of the clock distributor according to the first embodiment.

FIG. 8 illustrates a modification example of the clock distributor 100 according to the first embodiment.

The clock distributor 100 in the modification example includes a GM element 103A that converts the voltage of the clock OCKEX which is output by the phase locked loop 70 into the electric current IEX and thus outputs the result to the VCO 111, and a GM element 103B that converts the voltage of the clock OCKEX into the electric current IEX and thus outputs the result to the VCO 121.

That is, in the clock distributor 100 in the modification example, the clock OCKEX is applied to each of the VCO 111 and the VCO 121.

Therefore, since the two VCOs, the VCO 111 and the VCO 121, are locked by the common clock OCKEX, a feedback signal caused by the mutual application between the two VCOs, the VCO 111 and the VCO 121 are decreased. For this reason, a noise occurring within a loop of the two VCOs, the VCO 111 and the VCO 121 may be decreased further in the first embodiment described above.

Next, in addition to the clock distributor described above, clock distributors according to other embodiments are described below referring to FIGS. 9 to 13. An aspect of the clock distributor according to the other embodiments, which is not particularly described, is appropriately given the preceding description of the corresponding aspect of the clock distributor according to the first embodiment.

Figure 9:
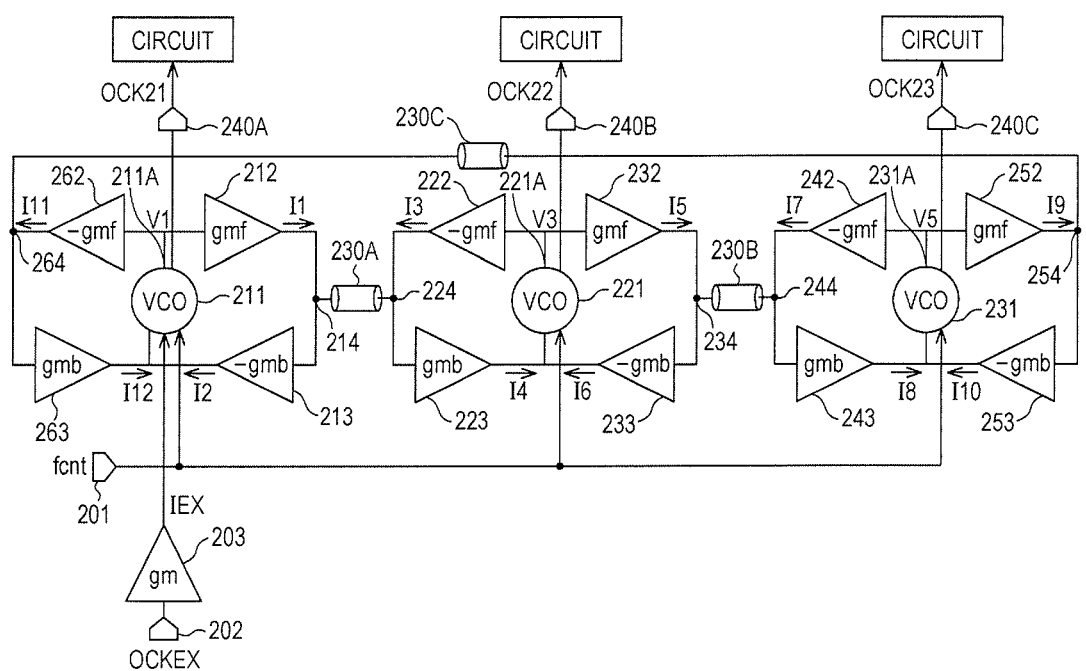
FIG. 9 illustrates a clock distributor according to a second embodiment.
Figure 10:
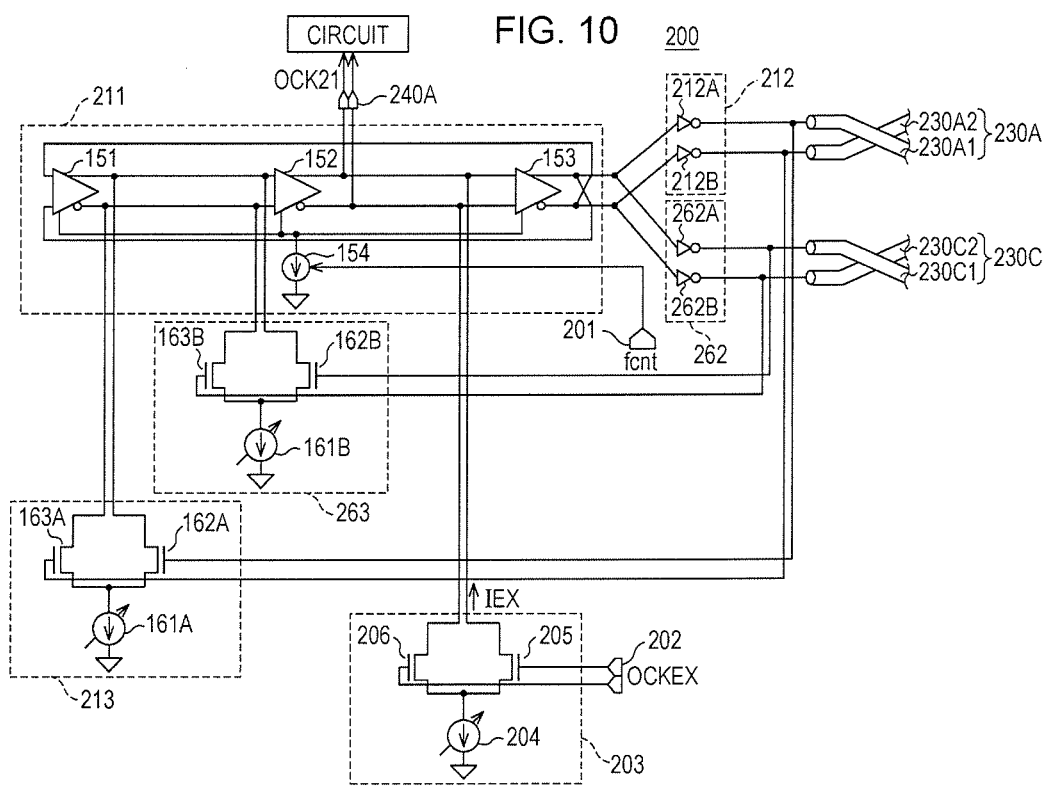
FIG. 10 illustrates a circuit configuration of the clock distributor according to the second embodiment.

FIG. 9 illustrates a clock distributor 200 according to a second embodiment. FIG. 10 illustrates a circuit configuration of the clock distributor 200 according to the second embodiment.

The clock distributor 200 includes a phase adjustment signal input terminal 201, VCOs 211, 221 and 231, GM elements 212, 213, 222, 223, 232, 233, 242, 243, 252, 253, 262, and 263, wiring 230A, wiring 230B, wiring 230C and output terminals 240A, 240B and 240C.

Furthermore, the clock distributor 200 includes a clock input terminal 202 to which a clock OCKEX from a phase locked loop 70 is input, and a GM element 203 that converts a voltage of the clock OCKEX into electric current IEX and thus outputs the result to the VCO 211.

In FIG. 9, the clock distributor 200 including the three VCOs, the VCO 211, the VCO 221, and the VCO 231 are illustrated, and the phase locked loop 70, a frequency measuring instrument 30, and a frequency control circuit 40 illustrated in FIG. 2 are omitted. A correspondence relationship between the clock distributor 200 illustrated in FIG. 9 like this, and a transmitting circuit 50 illustrated in FIG. 2 is as follows.

The VCO 211 corresponds to a VCO 64 illustrated in FIG. 2, and the clock OCKEX from the phase locked loop 70 is input to the VCO 211.

Furthermore, the VCOs 221 and 231 correspond to any two of VCOs 61 to 63 illustrated in FIG. 2. For this reason, the VCOs 221 and 231 are connected to the same transmitting units as any two of the transmitting units TX0 to TX2 and output clocks OCK22 and OCK23, respectively.

Furthermore, the GM elements 212, 213, 222, 223, 232, 233, 242, 243, 252, 253, 262, and 263, the wiring 230A, the wiring 230B, and the wiring 230C, which are illustrated in FIG. 9, illustrate combination relationships between the VCOs 211, 221 and 231 and are equivalent to combination relationships between the VCOs 61 to 64 represented by arrows A to C in FIG. 2.

As illustrated in FIG. 9, an oscillation node 211A of the VCO 211 is connected to one end (the left-hand end in FIG. 9) of the wiring 230A via the GM element 212 and the GM element 213 is feedback-connected to the VCO 211 and the GM element 212. The one end of the wiring 230A is connected to a connection portion 214 between the GM elements 212 and 213.

The GM element 212 has conductance gmf, and converts a clock, which is output from an oscillation node 211A of the VCO 211 (from a voltage V1), into electric current I1 and thus outputs the result.

The GM element 213 has conductance (−gmb), and converts a voltage of the connection portion 214 into electric current I2 and thus outputs the result to the VCO 211.

An oscillation node 221A of the VCO 221 is connected to the other end (the right-hand end in FIG. 9) of the wiring 230A via the GM element 222 and the GM element 223 is feedback-connected to the VCO 221 and the GM element 222. The other end of the wiring 230A is connected to a connection portion 224 between the GM elements 222 and 223.

The GM element 222 has the conductance (−gmf), and converts a clock, which is output from the oscillation node 221A of the VCO 221 (from a voltage V3), into electric current I3 and thus outputs the result.

The GM element 223 has the conductance gmb, and converts a voltage of the connection portion 224 into electric current I4 and thus outputs the result to the VCO 221.

The one end (the left-hand end in FIG. 9) of the wiring 230A is connected to the connection portion 214 between the GM elements 212 and 213, and the other end (the right-hand end in FIG. 9) is connected to the connection portion 224 between the GM elements 222 and 223. The wiring 230A is built with the wiring of a semiconductor integrated circuit.

Parasitic capacitance is present in the wiring 230A as in the wiring 130 of the clock distributor 100 according to the first embodiment.

As described above, the GM elements 212, 213, 222, and 223 are connected to the wiring 230A, in such a manner as to be symmetrical on the wiring 230A.

At this point, since the GM elements 212 and 222 convert clock voltages in opposite phase into electric current, a voltage according to a difference (=I1−I3) in output electric current between the GM elements 212 and 222 occurs in the wiring 230A. In the clock distributor 200 according to the second embodiment, subtraction between the output electric current I1 from the GM element 212 and the output electric current I3 from the GM element 222 is realized by connecting the clock voltages in opposite phase with wiring 230A using the GM elements 212 and 222.

Therefore, the GM elements 213 and 223 convert the voltages, which depend on the difference, into the electric current I2 and the electric current I4, and thus feed the result back to the VCOs 211 and 221, respectively. Since the GM elements 213 and 223 convert the voltages, which depend on the difference, into electric current together, the electric current I2 and the electric current I4 are equivalent in value to each other.

For this reason, the equivalent electric current may be fed back to the VCOs 211 and 221. This is realized by the symmetry of the circuit described above.

Furthermore, the oscillation node 221A of the VCO 221 is connected to one end (the left-hand end in FIG. 9) of the wiring 230B via the GM element 232 and the GM element 233 is feedback-connected to the VCO 221 and the GM element 232. The one end of the wiring 230B is connected to a connection portion 234 between the GM elements 232 and 233.

The GM element 232 has the conductance gmf, and converts a clock, which is output from the oscillation node 221A of the VCO 221 (from a voltage V3), into the electric current I5 and thus outputs the result.

The GM element 233 has the conductance (−gmb), and converts a voltage of the connection portion 234 into electric current I6 and thus outputs the result to the VCO 221.

An oscillation node 231A of the VCO 231 is connected to the other end (the right-hand end in FIG. 9) of the wiring 230B via the GM element 242 and the GM element 243 is feedback-connected to the VCO 231 and the GM element 242. The other end of the wiring 230B is connected to a connection portion 244 between the GM elements 242 and 243.

The GM element 242 has the conductance (−gmf), and converts a clock, which is output from the oscillation node 231A of the VCO 231 (from a voltage V5), into electric current I7 and thus outputs the result.

The GM element 243 has the conductance gmb, and converts a voltage of the connection portion 244 into electric current I8 and thus outputs the result to the VCO 231.

The one end (the left-hand end in FIG. 9) of the wiring 230B is connected to the connection portion 234 between the GM elements 232 and 233, and the other end (the right-hand end in FIG. 9) is connected to the connection portion 244 between the GM elements 242 and 243. The wiring 230B is built with the wiring of the semiconductor integrated circuit.

The parasitic capacitance is present in the wiring 230B as in the wiring 130 of the clock distributor 100 according to the first embodiment.

As described above, the GM elements 232, 233, 242, and 243 are connected to the wiring 230B, in such a manner to be symmetrical on the wiring 230B.

At this point, since the GM elements 232 and 242 convert clock voltages in opposite phase into electric current, a voltage, which depends on a difference (=I5−I7) in output electric current between the GM elements 232 and 242, occurs in the wiring 230B. In the clock distributor 200 according to the second embodiment, subtraction between the output electric current I5 from the GM element 232 and the output electric current I7 from the GM element 242 is realized by connecting the clock voltages in opposite phase with the wiring 230B using the GM elements 232 and 242.

Therefore, the GM elements 233 and 243 convert the voltages, which depend on the difference, into the electric current I6 and the electric current I8, and thus feed the result back to the VCOs 221 and 231, respectively. Since the GM elements 233 and 243 convert the voltages, which depend on the difference, into electric current together, the electric current I6 and the electric current I8 are equivalent in value to each other.

For this reason, the equivalent electric current may be fed back to the VCOs 221 and 231. This is realized by the symmetry of the circuit described above.

Furthermore, the oscillation node 231A of the VCO 231 is connected to one end (the right-hand end in FIG. 9) of the wiring 230C via the GM element 252 and the GM element 253 is feedback-connected to the VCO 231 and the GM element 252. The one end of the wiring 230C is connected to a connection portion 254 between the GM elements 252 and 253.

The GM element 252 has the conductance gmf, and converts the clock, which is output from the oscillation node 231A of the VCO 231 (from a voltage V5), into electric current I9 and thus outputs the result.

The GM element 253 has the conductance (−gmb), and converts a voltage of the connection portion 254 into electric current I10 and thus outputs the result to the VCO 231.

The oscillation node 211A of the VCO 211 is connected to the other end (the left-hand end in FIG. 9) of the wiring 230C via the GM element 262 and the GM element 263 is feedback-connected to the VCO 211 and the GM element 262. The other end of the wiring 230C is connected to a connection portion 264 between the GM elements 262 and 263.

The GM element 262 has the conductance (−gmf), and converts the clock, which is output from the oscillation node 211A of the VCO 211 (from a voltage V1), into electric current I11 and thus outputs the result.

The GM element 263 has the conductance gmb, and converts a voltage of the connection portion 264 into electric current I12 and thus outputs the result to the VCO 211.

The one end (the right-hand end in FIG. 9) of the wiring 230C is connected to the connection portion 254 between the GM elements 252 and 253, and the other end (the left-hand end in FIG. 9) is connected to the connection portion 264 between the GM elements 262 and 263. The wiring 230C is built with wiring of the semiconductor integrated circuit.

The parasitic capacitance is present in the wiring 230C as in the wiring 130 of the clock distributor 100 according to the first embodiment.

As described above, the GM elements 252, 253, 262, and 263 are connected to the wiring 230C, in such a manner as to be symmetrical on the wiring 230C.

At this point, since the GM elements 252 and 262 convert clock voltages in opposite phase into electric current, a voltage, which depends on a difference (=I9−I11) in output electric current between the GM elements 252 and 262, occurs in the wiring 230C. In the clock distributor 200 according to the second embodiment, subtraction between the output electric current I9 from the GM element 252 and the output electric current I11 from the GM element 262 is realized by connecting the clock voltages in opposite phase with wiring 230C using the GM elements 252 and 262.

Therefore, the GM elements 253 and 263 convert the voltages, which depend on the difference, into the electric current I10 and the electric current I12, and thus feed the result back to the VCOs 231 and 211, respectively. Since the GM elements 253 and 263 convert the voltages, which depend on the difference, into electric current together, the electric current I10 and the electric current I12 are equivalent in value to each other.

For this reason, the equivalent electric current may be fed back to the VCOs 231 and 211. This is realized by the symmetry of the circuit described above.

As described above, in the clock distributor 200, illustrated in FIG. 9, according to the second embodiment, the electric current (I2+I12, I4+I6, and I8+I10) that are fed back to the VCOs 211, 221, and 231, respectively, are equivalent to each other by symmetry of the circuit.

Therefore, in the clock distributor 200, when the clock OCKEX from the phase locked loop 70 is input to the clock input terminal 202 and thus the VCO 211 is in a locked state, the equivalent electric current may be fed back to the VCOs 211, 221 and 231 and thus the application of the mutual synchronization may be performed on the VCOs 211, 221 and 231. Therefore, the frequencies of clocks OCK21, OCK12 and OCK13 at which the VCOs 211, 221 and 231 oscillate, respectively, become equivalent to the clock OCKEX from the phase locked loop 70.

In terms of promptly synchronizing the VCO 211 and the VCOs 221 and 231 with the clock OCKEX, the size of the electric current IEX into which the clock OCKEX is converted may be greater than the electric current I2 and the electric current I12 that are output from the GM elements 213 and 263 to the VCO 211.

Moreover, in FIG. 9, the three VCOs, the VCO 211, the VCO 221, and the VCO 231 are connected to each other in the shape of a loop, but the three VCOs, the VCO 211, the VCO 221, and the VCO 231 are one example of the multiple oscillators. The multiple oscillators may be connected to each other in the shape of a loop, using two, or four or more oscillators.

The VCO 211, and the GM elements 212, 213, 262, and 263 make up one unit circuit section. The GM elements 212, 213, 262, and 263 are one example of first to fourth voltage current conversion elements, respectively. The connection portion 214 between the GM elements 212 and 213 is one example of a first connection portion, and the connection portion 264 between the GM elements 262 and 263 is one example of a second connection portion.

Similarly, the VCO 221 and the GM elements 222, 223, 232, and 233 make up one unit circuit section. The GM elements 232, 233, 222, and 223 are one example of the first to fourth voltage current conversion elements, respectively. The connection portion 234 between the GM elements 232 and 233 is one example of the first connection portion, and the connection portion 224 between the GM elements 222 and 223 is one example of the second connection portion.

Similarly, the VCO 231 and the GM elements 242, 243, 252, and 253 make up one unit circuit section. The GM elements 252, 253, 242, and 243 are one example of the first to fourth voltage current conversion elements, respectively. The connection portion 254 between the GM elements 252 and 253 is one example of the first connection portion, and the connection portion 244 between the GM elements 242 and 243 is one example of the second connection portion.

Furthermore, the connection portions 214, 234, and 254 make up the first connection portion, and the connection portions 224, 244, and 264 make up the second connection portion. The wiring portions 230A, 230B, and 230C connect between the connection portions 214 and 224, between the connection portions 234 and 244, and between connection portions 254 and 264, respectively. The connection portions 230A, 230B, and 230C are one example of the connection portion.

In this manner, the clock distributor 200 illustrated in FIG. 9, includes three unit circuit sections, and the three unit circuit sections are connected to each other in the shape of a loop by the wiring portions 230A, 230B, and 230C.

Next, a circuit of the clock distributor 200 according to the second embodiment is described in detail referring to FIG. 10.

FIG. 10 illustrates a circuit configuration of the clock distributor 200 according to the second embodiment. For the sake of convenience in description, only the VCO 211 and constituent elements connected to the VCO 211 in the clock distributor 200 according to the second embodiment are illustrated in FIG. 10, but due to the symmetry of the circuit configuration of the clock distributor 200 (refer to FIG. 9) the circuit configuration of the VCOs 221 and 232 and the vicinity of the VCOs 221 and 231 is the same as the circuit configuration illustrated in FIG. 10. Furthermore, in FIG. 10, the VCO 211, which is assumed to output a differential clock, is described.

The VCO 211 includes three-step inverters 151, 152, and 153, and an electric current source 154. The inverters 151 to 153, each of which is a current-starved type inverter, make up a ring oscillator. The VCO 211 is a type of ring oscillator.

That is, the inverters 151 to 153 are connected to each other in series, and a non-inversion output terminal of the inverter 153 is connected to an inversion input terminal (the lower input terminal in FIG. 10) of the inverter 151. Furthermore, an inversion output terminal of the inverter 153 is connected to a non-inversion input terminal (the upper input terminal in FIG. 10) of the inverter 151.

Moreover, each of the inverters 151 to 153 is an inverter that is realized as a CMOS device, as one example.

The free-running oscillation frequency of the VCO 211 is controlled by adjusting a value of output electric current from the electric current source 154 with a phase adjustment signal fcnt that is input to the phase adjustment signal input terminal 201.

Moreover, the clock OCK21, which is output by the VCO 211, may be taken from an output terminal of any one of the inverters 151 to 153 that make up the ring oscillator, but an output from the inverter 152 may be taken as an output from the VCO 211, as one example, in FIG. 10. A differential-form clock OCK21 is output from the output terminal 240A.

Furthermore, an input destination of the electric current I2 that is fed back from the GM element 213 may be the input terminal of any one of the inverters 151 to 153 that make up the ring oscillator, but the electric current I2 is input to the input terminal of the inverter 152 in FIG. 10.

The GM element 212 may be an element that converts the output from the VCO 211 into electric current, and inverters 212A and 212B are used as the GM element 212 in FIG. 10. Conductances of the inverters 212A and 212B are all gmf.

An output terminal of the inverter 212A is connected to the GM element 213 and is connected to the GM element 222 via the wiring portion 230A1 of the wiring 230A. The non-inversion output terminal of the inverter 153 of the VCO 211 is connected to the inverter 212A.

An output terminal of the inverter 212B is connected to the GM element 213 and is connected to the GM element 222 via a wiring portion 230A2 of the wiring 230A. The inversion output terminal of the inverter 153 of the VCO 211 is connected to the inverter 212B.

The GM element 213 includes a current source 161A and two NMOS transistors 162A and 163A.

One end (the upper terminal in FIG. 10) of the electric current source 161A is connected to the sources of the NMOS transistors 162A and 163A and the other end (the lower terminal in FIG. 10) is grounded.

The source of the NMOS transistor 162A is connected to the source of the NMOS transistor 163A and is connected to the electric current source 161A, and a drain of the NMOS transistor 162A is connected between the non-inversion output terminal of the inverter 151 and the non-inversion input terminal of the inverter 152.

The source of the NMOS transistor 163A is connected to the source of the NMOS transistor 162A and is connected to the electric current source 161A, and a drain of the NMOS transistor 163A is connected between the inversion output terminal of the inverter 151 and the inversion input terminal of the inverter 152.

The GM element 262 may be an element that converts the output from the VCO 211 into electric current, and inverters 262A and 262B are used as the GM element 262 in FIG. 10. Conductances of the inverters 262A and 262B are all (−gmf).

An output terminal of the inverter 262A is connected to the GM element 263 and is connected to the GM element 252 via a wiring portion 230C1 of the wiring 230C. The non-inversion output terminal of the inverter 153 of the VCO 211 is connected to the inverter 262A.

An output terminal of the inverter 262B is connected to the GM element 263 and is connected to the GM element 252 via the wiring portion 230C2 of the wiring 230C. The inversion output terminal of the inverter 153 of the VCO 211 is connected to the inverter 262B.

The GM element 263 includes a current source 161B and two NMOS transistors 162B and 163B.

One end (the upper terminal in FIG. 10) of the electric current source 161B is connected to the sources of the NMOS transistors 162B and 163B and the other end (the lower terminal in FIG. 10) is grounded.

The source of the NMOS transistor 162B is connected to the source of the NMOS transistor 163B and is connected to the electric current source 161B, and a drain of the NMOS transistor 162B is connected between the non-inversion output terminal of the inverter 151 and the non-inversion input terminal of the inverter 152.

The source of the NMOS transistor 163B is connected to the source of the NMOS transistor 162B and is connected to the electric current source 161B, and a drain of the NMOS transistor 163B is connected between the inversion output terminal of the inverter 151 and the inversion input terminal of the inverter 152.

The electric current IEX into which a differential-form clock OCKEX is converted from the GM element 203 is input to the VCO 211 described above.

The GM element 203 includes an electric current source 204 and two NMOS transistors 205 and 206.

One end (the upper terminal in FIG. 10) of the electric current source 204 is connected to the sources of the NMOS transistors 205 and 206 and the other end (the lower terminal in FIG. 10) is grounded.

The source of the NMOS transistor 205 is connected to the source of the NMOS transistor 206 and is connected to the electric current source 204, and a drain of the NMOS transistor 205 is connected between the non-inversion output terminal of the inverter 152 and the non-inversion input terminal of the inverter 153.

The source of the NMOS transistor 206 is connected to the source of the NMOS transistor 205 and is connected to the electric current source 204, and a drain of the NMOS transistor 206 is connected between the inversion output terminal of the inverter 152 and the inversion input terminal of the inverter 153.

Moreover, the electric current IEX, which is output by the GM element 203, is input between the inverter 152 and the inverter 153, but the electric current IEX, which is output by the GM element 203, may be input between the other inverters.

As described above, the circuit configuration of the VCO 211 and the circuit connected to the VCO 211 in the clock distributor 200 according to the second embodiment are illustrated in FIG. 10. The circuit configuration of the VCO 221 and the circuit connected to the VCO 221, and the circuit configuration of the VCO 231 and the circuit connected to the VCO 231 are the same as the circuit configuration of the VCO 211 and the circuit connected to the VCO 211, except that the electric current IEX into which the differential-form clock OCKEX from the GM element 203 is converted is input to the VCO 211.

Then in the clock distributor 200 according to the second embodiment, a voltage caused by a difference signal between the output signal of the oscillation node 211A of the VCO 211 and the output signal of the oscillation node 221A of the VCO 221 occurs in the wiring 230A, as in the clock distributor 100 according to the first embodiment.

Furthermore, the voltage caused by a difference signal between the output signal of the oscillation note 221A of the VCO 221 and the output signal of the oscillation node 231A of the VCO 231 occurs in the wiring 230B. Furthermore, the voltage caused by a difference signal between the output signal of the oscillation note 231A of the VCO 231 and the output signal of the oscillation node 211A of the VCO 211 occurs in the wiring 230C.

Therefore, when the clock OCKEX from the phase locked loop 70 is input to the clock input terminal 102 and thus the VCO 211 is in the locked state, the equivalent electric current may be fed back to the VCOs 211, 221 and 231 and thus the application of the mutual synchronization may be performed on the VCOs 211, 221 and 231. Therefore, the frequencies of clocks OCK21, OCK22, and OCK23 at which the VCOs 211, 221 and 231 oscillate, respectively, become equivalent to each other.

According to the second embodiment, the VCOs 211 and 221 are combined via the GM elements 212 and 222 and the wiring 230A without connecting directly the oscillation nodes of the VCO as is the case in the related art, in such a manner that the difference signal is obtained between the output signal of the oscillation node 211A of the VCO 211 and the output signal of the oscillation node 221A of the VCO 221.

That is, the subtraction between the output electric current I1 from the GM element 212 and the output electric current I3 from the GM element 222 is realized by connecting the clock voltages in opposite phase with the wiring 230A using the GM elements 212 and 222.

Then the electric current (the electric current representing the difference signal between the output signal of the oscillation node 211A of the VCO 211 and the output signal of the oscillation node 221A of the VCO 221) obtained by the subtraction is fed back to the VCOs 211 and 221.

Similarly, the VCOs 221 and 231 are combined via the GM elements 232 and 242 and wiring 230B, in such a manner that the difference signal between the output signal of the oscillation node 221A of the VCO 221 and the output signal of the oscillation node 231A of the VCO 231 is obtained.

Then the electric current (the electric current representing the difference signal between the output signal of the oscillation node 221A of the VCO 221 and the output signal of the oscillation node 231A of the VCO 231) obtained by the subtraction is fed back to the VCOs 221 and 231.

Similarly, the VCOs 231 and 211 are combined via the GM elements 252 and 262 and wiring 230C, in such a manner that the difference signal between the output signal of the oscillation node 231A of the VCO 231 and the output signal of the oscillation node 211A of the VCO 211 is obtained.

Then the electric current (the electric current representing the difference signal between the output signal of the oscillation node 231A of the VCO 231 and the output signal of the oscillation node 211A of the VCO 211) obtained by the subtraction is fed back to the VCOs 231 and 211.

When this is done, increases in the loads of the oscillation nodes 211A, 221A, and 231A on the VCOs 211, 221 and 231, respectively, which is the case in the related art, may be suppressed, and the oscillation caused by the application of the mutual synchronization at a higher frequency than in the related art may be realized, as in the clock distributor 100 according to the first embodiment.

Furthermore, since the VCOs 211, 221 and 231 oscillate at the same frequency caused by the application of the mutual synchronization as illustrated above, the clocks OCK21, OCK22 and OCK23 are decreased in skew. For this reason, the clock distributor 200 may distribute the clocks OCK21, OCK22, and OCK23 that are decreased in skew, from the VCOs 211, 221 and 231, respectively.

Furthermore, according to the second embodiment, the VCO 211 is locked by inputting the clock OCKEX from the phase locked loop 70 that generates the clock with little noise, and additionally the mutual synchronization is applied between the VCO 211, the VCO 221, and the VCO 231. For this reason, the clock distributor 200 may distribute the clock with little noise, from the VCOs 211, 221 and 231.

Moreover, the clock distributor 200 including the three unit circuit sections is described above, but the number of the unit circuit sections is not limited to 3, and may be two or more.

Furthermore, the clock OCKEX which is output by the phase locked loop 70 is described above as applied to the VCO 211, but the clock OCKEX may be applied to the VCO 221, or the VCO 231.

Figure 11:
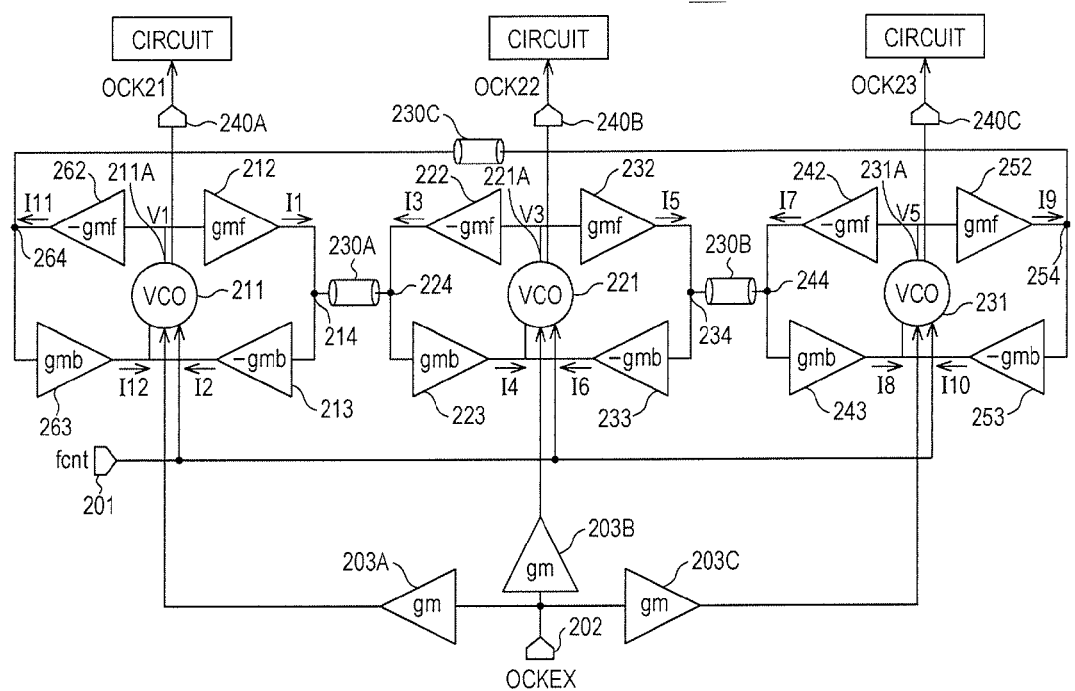
FIG. 11 illustrates a modification example of the clock distributor according to the second embodiment.

FIG. 11 illustrates a modification example of the clock distributor 200 according to the second embodiment.

The clock distributor 200 in the modification example includes a GM element 203A that converts a voltage of a clock OCKEX from a phase locked loop 70 into electric current IEX and thus outputs the result to a VCO 211, a GM element 203B that converts the voltage of the clock OCKEX into the electric current IEX and thus outputs the result to the VCO 221, and a GM element 203C that converts the voltage of the clock OCKEX into the electric current IEX and thus outputs the result to VCO 231.

That is, in the clock distributor 200 in the modification example, the clock OCKEX is applied to each of the VCO 211, the VCO 221 and the VCO 231.

Therefore, since each of the three VCOs, the VCO 211, the VCO 221 and the VCO 231, is locked by the common clock OCKEX, a feedback signal caused by the mutual application between the three VCOs, the VCO 211, the VCO 221 and the VCO 231 is decreased. For this reason, a noise occurring within a loop of the three VCOs, the VCO 211, the VCO 221 and the VCO 231 may be decreased more than in the second embodiment described above.

Figure 12:
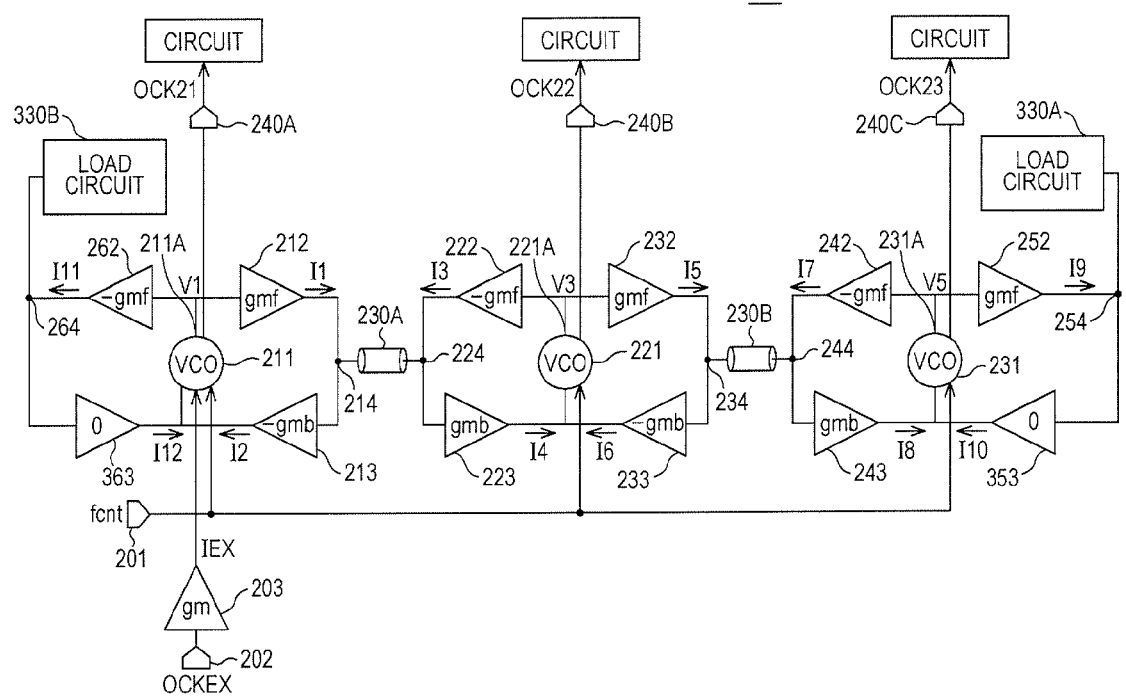
FIG. 12 illustrates a clock distributor according to a third embodiment.

FIG. 12 illustrates a clock distributor 300 according to a third embodiment.

The clock distributor 300 includes a phase adjustment signal input terminal 201, VCOs 211, 221 and 231, GM elements 212, 213, 222, 223, 232, 233, 242, 243, 252, 262, 353, and 363, wiring 230A, wiring 230B, output terminals 240A, 240B and 240C, and load circuits 330A and 330B.

Furthermore, the clock distributor 300 includes a clock input terminal 202 to which a clock OCKEX from a phase locked loop 70 is input, and a GM element 203 that converts a voltage of the clock OCKEX into electric current IEX and thus outputs the result to the VCO 211.

The clock distributor 300 according to the third embodiment includes the load circuits 330A and 330B instead of the wiring 230C according to the second embodiment, and includes the GM elements 353 and 363 instead of the GM elements 253 and 263 according to the second embodiment.

Because the other configurations are the same as in the clock distributor 200 according to the second embodiment, like reference numerals are given to like constituent elements and their descriptions are omitted.

The load circuit 330A is connected to a connection portion 254 between the GM elements 252 and 353. For example, a capacitive element of which capacitance is equivalent in value to parasitic capacitance of each of the wiring 230A and the wiring 230B may be used as the load circuit 330A. The load circuit 330A terminates the connection portion 254.

The load circuit 330B is connected to a connection portion 264 between the GM elements 262 and 363. As in the load circuit 330A, the capacitive element of which capacitance is equivalent in value to the parasitic capacitance of each of the wiring 230A and the wiring 230B may be used as the load circuit 330B. The load circuit 330B terminates the connection portion 264.

The GM elements 353 and 363 make electric current values of the electric current source 161A and 161B (refer to FIG. 10) zero, respectively.

That is, electric current flowing through the GM elements 353 and 363 is the same as that flowing through the GM elements 253 and 263 according to the second embodiment.

The clock distributor 300 according to the third embodiment includes three unit circuit sections, and the unit circuit sections positioned at both ends of the three unit circuit sections illustrated in FIG. 12 are terminated by the load circuits 330A and 330B, respectively.

For this reason, in the clock distributor 300 according to the third embodiment, the three unit circuit sections are connected to each other in series.

In the clock distributor 300 illustrated in FIG. 12, when the clock OCKEX from the phase locked loop 70 is input to the clock input terminal 202 and thus the VCO 211 is in a locked state, equivalent electric current may be fed back both between the VCO 211 and the VCO 221 and between the VCO 221 and VCO 231 and application of the mutual synchronization may be performed on the VCOs 211, 221, and 231. Therefore, frequencies of clocks OCK21, OCK22 and OCK23 at which the VCOs 211, 221 and 231 oscillate, respectively, become equivalent to the clock OCKEX from the phase locked loop 70.

As described above, in the clock distributor 300 according to the third embodiment, the VCOs 211, 221 and 231 may oscillate at the same frequency caused by the application of the mutual synchronization as in the clock distributor 200 according to the second embodiment.

Moreover, the example is described in FIG. 12 in which the three unit circuit sections are connected to each other in series, but when increasing the number of the unit circuit sections, the application of the mutual synchronization may be performed on the VCO included in each unit circuit section by connecting 4 or more unit circuit sections in series, and thus the oscillation at the same frequency may occur. For example, when the number of the unit circuit sections is 5, the clock distributor included in the transmitting circuit 50 illustrated in FIG. 2 may be realized.

According to the third embodiment described above, dimensions of the clock distributor may be made small by decreasing the number of circuit elements and the wiring.

Figure 13:
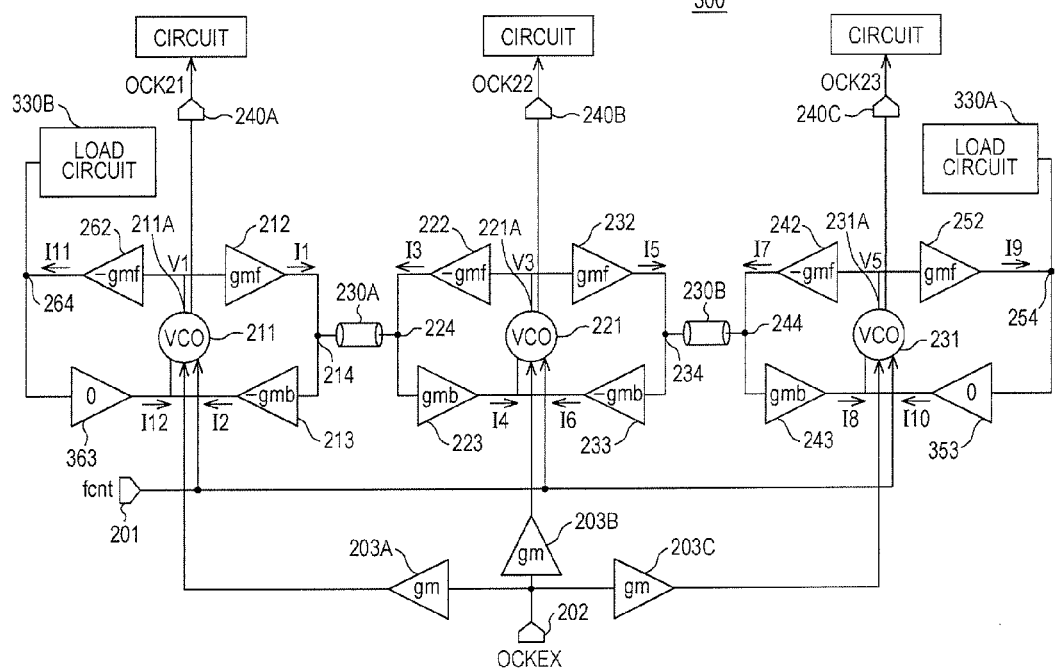
FIG. 13 illustrates a modification example of the clock distributor according to the third embodiment.

FIG. 13 illustrates a modification example of the clock distributor 300 according to the third embodiment.

The clock distributor 300 in the modification example includes a GM element 203A that converts a voltage of a clock OCKEX from a phase locked loop 70 into electric current IEX and thus outputs the result to a VCO 211, a GM element 203B that converts the voltage of the clock OCKEX into the electric current IEX and thus outputs the result to the VCO 221, and a GM element 203C that converts the voltage of the clock OCKEX into the electric current IEX and thus outputs the result to VCO 231.

That is, in the clock distributor 200 in the modification example, the clock OCKEX is applied to each of the VCO 211, the VCO 221 and the VCO 231.

Therefore, since each of the three VCOs, the VCO 211, the VCO 221 and the VCO 231, is locked by the common clock OCKEX, a feedback signal caused by the mutual application between the three VCOs, the VCO 211, the VCO 221 and the VCO 231 is decreased. For this reason, the noise occurring within a loop of the three VCOs, the VCO 211 the VCO 221 and the VCO 231 may be decreased more than in the third embodiment described above.

Appropriate changes may be made to the clock distributor and the electronic apparatus described above according to the embodiments, without deviating from the technological idea behind the embodiments. Furthermore, configuration requirements for one embodiment may be appropriately applied to the other embodiments as well.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock distributor, comprising:
a first unit circuit section, a second unit circuit section, and a third unit circuit section, each unit circuit section being configured to receive a common control signal for controlling an oscillation frequency;
a first wiring portion connecting the first unit circuit section and the second unit circuit section;
a second wiring portion connecting the second unit circuit section and the third unit circuit section;
a third wiring portion configured to connect the first unit circuit section and the third unit circuit section, wherein each of the first, second and third unit circuit sections includes an oscillator configured to receive a clock through a voltage current conversion element;
a first voltage current conversion element configured to convert an output from the oscillator of the first unit circuit section into an electric current, and to output a result to a first connection portion of the first unit circuit section, the first connection portion connecting to the first wiring portion that connects to a second connection portion of the second unit circuit section;
a second voltage current conversion element configured to convert an output of the first connection portion of the first unit circuit section into an electric current, and to output a result to the oscillator of the first unit circuit section;
a third voltage current conversion element configured to convert the output from the oscillator of the first unit circuit section into an electric current, and to output a result to a second connection portion of the first unit circuit section, the second connection portion connecting to the third wiring portion that connects to the third unit circuit section, and
a fourth voltage current conversion element configured to convert an output of the second connection portion of the first unit circuit section into an electric current, and to output a result to the oscillator of the first unit circuit section, wherein:
a first voltage occurs in the first connection portion based on a difference between the electric current into which the output from the oscillator of the first unit circuit section is converted and the electric current into which an output from the oscillator of the second unit circuit section is converted, and
a second voltage occurs in the second connection portion based on a difference between the electric current into which the output from the oscillator of the first unit circuit section is converted and the electric current into which an output from the oscillator of the third unit circuit section is converted.

2. The clock distributor according to claim 1, wherein the first voltage current conversion element and the third voltage current conversion element are inverters.

3. The clock distributor according to claim 1, wherein the first, second and third unit circuit sections are connected to each other in the shape of a loop.

4. The clock distributor according to claim 1, wherein the first, second and third unit circuit sections are connected to each other in series, and
wherein conductance of the second voltage current conversion element of the first unit circuit section positioned on one end side of the series-connected first, second and third unit circuit sections and conductance of the fourth voltage current conversion element of the first unit circuit section positioned on the other end side of the series-connected first, second and third unit circuit sections are zero.

5. The clock distributor according to claim 4, wherein a capacitance load is connected to the first connection portion of the first unit circuit section positioned on the one end side of the series-connected first, second and third unit circuit sections and to the second connection portion of the first unit circuit section positioned on the other end side of the series-connected first, second and third unit circuit sections.

6. The clock distributor according to claim 1, further comprising:
a frequency measuring instrument configured to measure a signal frequency, at which the oscillator of the first unit circuit section, among the plurality of unit circuit sections to which to apply a clock from the outside, oscillates.

7. The clock distributor according to claim 6, further comprising a frequency control circuit configured to:
generate the common control signal based on an output of the frequency measuring instrument measuring the signal frequency, and
output the generated, common control signal to the oscillators of the plurality of unit circuit sections.

8. The clock distributor according to claim 7, wherein the frequency control circuit comprises:
a comparator configured to compare a given frequency setting value with the output of the frequency measuring instrument measuring the signal frequency, and
a control signal generation circuit configured to generate the common control signal based on the comparison by the comparator.

9. A clock distributor, comprising:
a first oscillator and a second oscillator, each oscillator being configured to receive a common control signal for controlling an oscillation frequency and a clock;
a wiring portion configured to connect the first oscillator and the second oscillator;
a first voltage current conversion element configured to convert an output from the first oscillator into an electric current, and to output a result to a first connection portion connecting to the wiring portion;
a second voltage current conversion element configured to convert a voltage of the first connection portion into an electric current, and to output a result to the first oscillator;
a third voltage current conversion element configured to convert an output from the second oscillator into an electric current, and to output a result to a second connection portion connecting to the wiring portion; and
a fourth voltage current conversion element configured to convert a voltage of the second connection portion into an electric current, and to output a result to the second oscillator, wherein a voltage occurs in the first connection portion and the second connection portion based on a difference between the electric current into which the output from the first oscillator is converted and the electric current into which the output from the second oscillator is converted.

10. An electronic apparatus, comprising:
a clock distributor including:
- a first unit circuit section, a second unit circuit section, a third unit circuit section, each unit circuit section including an oscillator and being configured to receive a common control signal for controlling an oscillation frequency;
- a first wiring portion connecting the first unit circuit section and the second unit circuit section; and
- a second wiring portion connecting the second unit circuit section and the third unit circuit section,
- a third wiring portion configured to connect the first unit circuit section and the third unit circuit section,
- a first voltage current conversion element configured to convert an output from the oscillator of the first unit circuit section into an electric current, and to output a result to a first connection portion of the first unit circuit section, the first connection portion connecting to the first wiring portion that connects to the second unit circuit section,
- a second voltage current conversion element configured to convert a voltage of the first connection portion into an electric current, and to output a result to the oscillator of the first unit circuit section,
- a third voltage current conversion element configured to convert the output from the oscillator of the first unit circuit section into the electric current, and to output a result to a second connection portion of the first unit circuit section, the second connection portion connecting to the third wiring portion that connects to another of the plurality of unit circuit sections, and
- a fourth voltage current conversion element configured to convert the voltage of the second connection portion of the first unit circuit section into an electric current, and to output a result to the oscillator of the first unit circuit section, wherein:
- a first voltage occurs in the first connection portion based on a difference between the electric current into which the output from the oscillator of the first unit circuit section is converted and the electric current into which an output from the oscillator of the second unit circuit section is converted, and
- a second voltage occurs in the second connection portion based on a difference between the electric current into which the output from the oscillator of the first unit circuit section is converted and the electric current into which an output from the oscillator of the third unit circuit section is converted; and
a circuit configured to operate based on the clock provided by the clock distributor.

* * * * *